United States Patent
Wang et al.

(10) Patent No.: US 9,481,567 B2
(45) Date of Patent: Nov. 1, 2016

(54) MEMS STRUCTURE, CAP SUBSTRATE AND METHOD OF FABRICATING THE SAME

(71) Applicant: TAIWAN SEMICONDUCTOR MANUFACTURING CO., LTD., Hsinchu (TW)

(72) Inventors: I-Shi Wang, New Taipei (TW); Yu-Jui Chen, Taipei (TW); Ting-Ying Chien, Hsinchu (TW); Jen-Hao Liu, Zhunan Township (TW); Ren-Dou Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 99 days.

(21) Appl. No.: 14/302,982

(22) Filed: Jun. 12, 2014

(65) Prior Publication Data
US 2015/0360938 A1    Dec. 17, 2015

(51) Int. Cl.
| H01L 27/14 | (2006.01) |
| B81B 7/00 | (2006.01) |
| B81C 1/00 | (2006.01) |
| B81B 3/00 | (2006.01) |

(52) U.S. Cl.
CPC .......... B81B 7/0077 (2013.01); B81B 3/0005 (2013.01); B81C 1/0096 (2013.01); B81C 1/00269 (2013.01); B81C 1/00333 (2013.01); B81C 1/00373 (2013.01)

(58) Field of Classification Search
CPC .................... B81C 2201/112; B81C 2201/11; B81C 1/0096; B81C 1/0269; B81C 1/00333; B81C 1/00373; B81C 1/00269; B81B 7/0077; B81B 2007/115; B81B 3/005
See application file for complete search history.

(56) References Cited

U.S. PATENT DOCUMENTS

| 4,877,650 A | * | 10/1989 | Matsuyama | ............ C23C 16/24 257/E21.101 |
| 8,507,306 B2 | * | 8/2013 | Chen | ..................... B81B 3/0005 257/414 |
| 2011/0205615 A1 | * | 8/2011 | Tung | ...................... B81B 3/001 359/290 |
| 2011/0221013 A1 | * | 9/2011 | Partridge | ............ B81C 1/00333 257/414 |
| 2011/0305874 A1 | * | 12/2011 | Thoumazet | ............. C03C 17/42 428/172 |
| 2013/0102101 A1 | * | 4/2013 | Cheng | ................. B81C 1/00333 438/51 |

* cited by examiner

Primary Examiner — Michael Trinh
(74) Attorney, Agent, or Firm — Maschoff Brennan

(57) ABSTRACT

A micro electro mechanical system (MEMS) structure is provided, which includes a first substrate, a second substrate, a MEMS device and a hydrophobic semiconductor layer. The first substrate has a first portion. The second substrate is substantially parallel to the first substrate and has a second portion substantially aligned with the first portion. The MEMS device is between the first portion and the second portion. The hydrophobic semiconductor layer is made of germanium (Ge), silicon (Si) or a combination thereof on the first portion, the second portion or the first portion and the second portion and faces toward the MEMS device. A cap substrate for a MEMS device and a method of fabricating the same are also provided.

19 Claims, 4 Drawing Sheets

MEMS STRUCTURE, CAP SUBSTRATE AND METHOD OF FABRICATING THE SAME

BACKGROUND

Micro-Electro-Mechanical Systems (MEMS) is a technology generally referred to as miniaturized mechanical and electro-mechanical elements (i.e., devices and structures) that are made using the techniques of microfabrication. MEMS structures are recently developed in the field of integrated circuit technology in which MEMS devices are formed on a substrate to feature mechanical and electrical features. The MEMS devices include such as sensors, valves, gears, actuators, mirrors, heaters, printer nozzles and so on. In order to protect against external interference during the operation of the MEMS structure, it is desirable to bond with a cap substrate to hermetically seal the MEMS devices from surroundings.

However, failures may occur during or after the substrate on which the MEMS devices are formed is bonded with the cap substrate, which results in poor reliability. Accordingly, there are needs for a MEMS structure with high reliability and a method for manufacturing the same.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
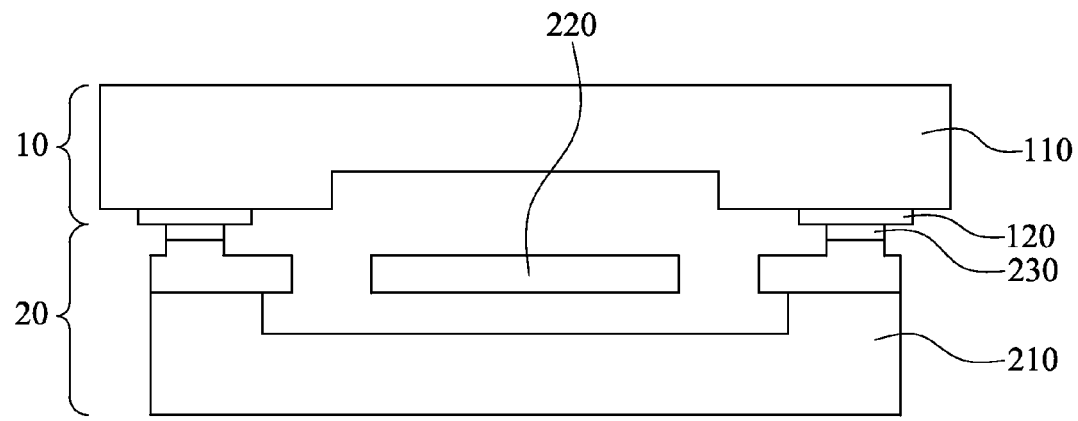
FIG. 1 is a cross-sectional view of a general micro electro mechanical system (MEMS) structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned, failures may occur during or after a substrate on which micro electro mechanical system (MEMS) devices are formed is bonded with a cap substrate, which results in poor reliability. It is found that the major failure is adhesion of the MEMS devices to other objects. Specifically, as shown in FIG. 1, which is a cross-sectional view of a general MEMS structure. The MEMS structure includes a cap substrate 10 and a device substrate 20. The cap substrate 10 includes a substrate 110 and a bonding pad 120 thereon. The device substrate 20 includes a substrate 210, a MEMS device 220 and a bonding pad 230. The MEMS device 220 is between the substrates 110, 210. The bonding pads 120, 230 are bonded with each other to hermetically seal the MEMS device 220. However, the MEMS device 220 is possible to adhere to a lower surface of the substrate 110 or an upper surface of the substrate 210 during operation, which leads to low reliability.

To address the above issue, a hydrophobic material may be applied on the surface toward the MEMS device 220 of FIG. 1 to reduce adhesion strength between the surface and the MEMS device 220. For example, hydrophobic compound such as organosilanes (e.g., octadecyltrichlorosilane (OTS) or perfluorodecyltrichlorosilane (FDTS)) may be used. Nevertheless, byproduct such as water is generated during or after the hydrophobic compound is contacted with the surface and will become an outgassing source. Accordingly, in accordance of various embodiments of the present disclosure, it is provided a hydrophobic semiconductor layer on the surface toward the MEMS device to reduce adhesion of the MEMS device to the surface and to avoid the drawback of using the hydrophobic compound. It is noted that in the specification, the term "hydrophobic semiconductor layer" refers to a surface of the hydrophobic semiconductor layer having a water contact angle greater than or equal to 80°. Various embodiments of the present disclosure will be described in detail below.

Figure 2:
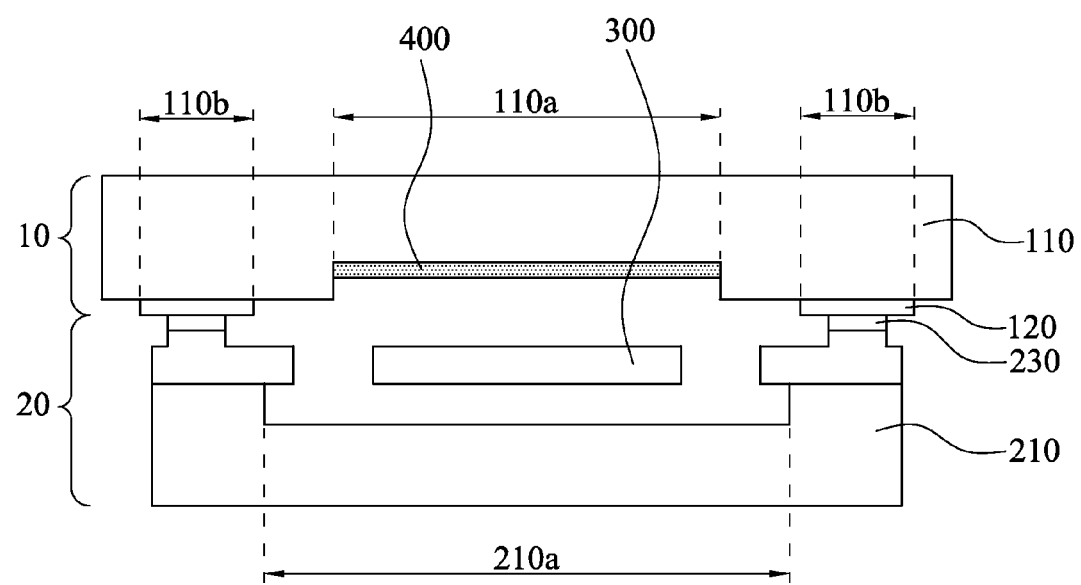
FIG. 2 is a cross-sectional view of a MEMS structure in accordance with some embodiments.

FIG. 2 is a cross-sectional view of a MEMS structure in accordance with some embodiments. Referring to FIG. 2, the MEMS structure includes a first substrate 110, a second substrate 210 substantially parallel to the first substrate 110, a MEMS device 300 and a hydrophobic semiconductor layer 400. In some embodiments, the first substrate 110 is included in a cap substrate 10, and the second substrate 210 is included in a device substrate 20. The cap substrate 10 and the device substrate 20 may be bonded by a eutectic bonding, a diffusion bonding or other suitable types of bonding to seal the MEMS device 300.

The first substrate 110 and/or the second substrate 210 may include a silicon substrate or a non-silicon substrate, such as a ceramic substrate. In some embodiments, the first substrate 110 and/or the second substrate 210 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In some embodiments, the first substrate 110 included in the cap substrate 10 is a silicon substrate.

In some embodiments, the device substrate 20 includes not only the second substrate 210 but also integrated circuits, such as memory cells, analog circuits, logic circuits and/or mixed-signal circuits (not shown). The second substrate 210 may include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. In some embodiments, the second substrate 210 includes one or more CMOS devices, such as transistors (e.g., NMOS and/or PMOS transistors). In some embodiments, the second substrate 210 includes circuitry associated with the transistors such as interconnect layers (e.g., metal lines and vias) and interlayer dielectric (ILD) layers. In some embodiments, the second substrate 210 also includes isolation structures and/or any other elements associated with integrated circuitry.

The MEMS device 300 may include a spring, a proof mass, an actuator, a sensor, a valve, a gear, a mirror, a heater, a printer nozzle, an accelerometer, a gyroscope and/or any suitable MEMS device. In some embodiments, the MEMS structure 300 includes a movable element, such as a spring or a proof mass. The MEMS device 300 is disposed between the first substrate 110 and the second substrate 210. Specifically, the first substrate 110 has a first portion 110a, and the second substrate 210 has a second portion 210a substantially aligned with the first portion 110a. The MEMS device 300 is disposed between the first portion 110a and the second portion 210a. The term "substantially aligned" refers to align with some acceptable deviation and does not require exact alignment.

Figure 3:
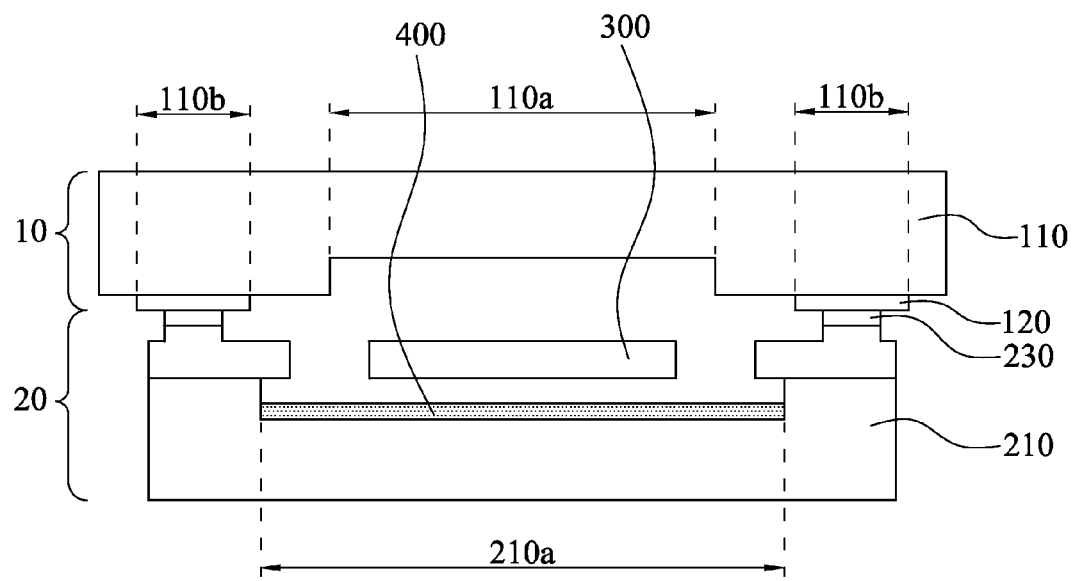
FIG. 3 is a cross-sectional view of a MEMS structure in accordance with some embodiments.
Figure 4:
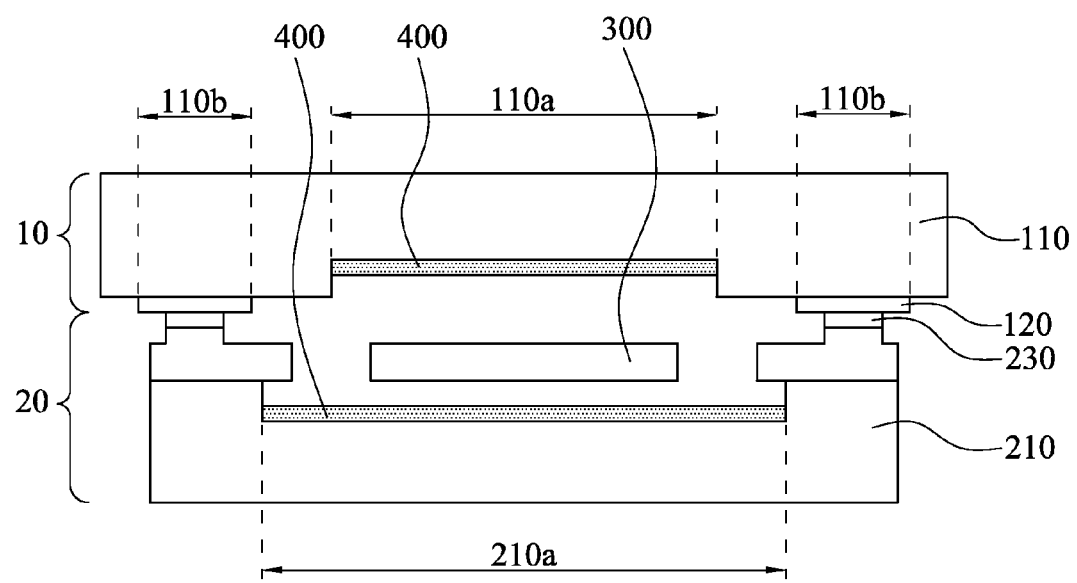
FIG. 4 is a cross-sectional view of a MEMS structure in accordance with some embodiments.

To address the issue of adhesion between the MEMS device 300 and the surface surrounding the MEMS 300, the hydrophobic semiconductor layer 400 is provided on the surface facing toward the MEMS device 300. In some embodiments, the hydrophobic semiconductor layer 400 is formed on the first portion 110a, the second portion 210a or the first portion 110a and the second portion 210a, as shown in FIGS. 2-4. The position on which the hydrophobic semiconductor layer 400 is disposed may be decided based on a range of movement of the MEMS device 300.

In some embodiments, the hydrophobic semiconductor layer 400 is made of germanium (Ge), silicon (Si) or a combination thereof. In some embodiments, the hydrophobic semiconductor layer 400 is crystallized. Specifically, a recrystallization process may be performed on a semiconductor material (e.g., Ge or Si or a combination thereof) to form a crystallized semiconductor layer. The crystallized semiconductor layer formed after the recrystallization process may have a large grain size and high roughness and thus can exhibit a high water contact angle; that is, the crystallized semiconductor layer is hydrophobic, and thus may be acted as the hydrophobic semiconductor layer 400. In some embodiments that the hydrophobic semiconductor layer 400 is crystallized, the hydrophobic semiconductor layer 400 has a grain size in a range of 0.08 micron to 0.2 micron. In some embodiments, the hydrophobic semiconductor layer 400 has a roughness (RMS) in a range of 8 nm to 15 nm.

In some embodiments, the hydrophobic semiconductor layer 400 further includes a dopant selected from the group consisting of Group IIIA elements including boron (B), aluminum (Al), gallium (Ga), indium (In), thallium (Tl)) and Group VA elements including nitrogen (N), phosphorous (P), arsenic (As), antimony (Sb), or bismuth (Bi). The dopant may be utilized to induce and accelerate recrystallization of the semiconductor material. In some embodiments, the hydrophobic semiconductor layer 400 is made of Ge, and the dopant is Sb.

The cap substrate 10 further includes a first bonding pad 120 on the first substrate 110. The first bonding pad 120 may be made of metal, alloy or semiconductor materials. In some embodiments, the first bonding pad 120 is composed of the same material of the hydrophobic semiconductor layer 400. In some embodiments of FIG. 2, the first bonding pad 120 and the hydrophobic semiconductor layer 400 are formed from the same material and using a same photolithographic and etching processes. In other words, there is no need for additional deposition and patterning processes to form the hydrophobic semiconductor layer 400.

The device substrate 20 further includes a second bonding pad 230 on the second substrate 210 and bonded with the first bonding pad 120. In some embodiments, the second bonding pad 230 is made of a material selected from the group consisting of aluminum (Al), gold (Au), titanium (Ti), tantalum (Ta), nickel (Ni) and tin (Sn). In some embodiments, a eutectic bonding such as Ge/Al, Ge/Au or Si/Au is formed between the first bonding pad 110 and the second bonding pad 230. In some embodiments, a diffusion bonding such as Si/Al or Si/Ti is formed between the first bonding pad 110 and the second bonding pad 230. In addition, a layer (not marked) between the second bonding pad 230 and the second substrate 210 may include circuitry, which may be associated with the MEMS device 300.

Another aspect of the present disclosure provides a cap substrate for a MEMS device. As shown in FIG. 2, the cap substrate 10 includes the substrate 110 and the hydrophobic semiconductor layer 400. The hydrophobic semiconductor layer 400 is made of Ge, Si or a combination thereof and covers the portion 110a of the substrate 110 configured to face toward the MEMS device 300. Various embodiments of the hydrophobic semiconductor layer 400 may be the same as those embodiments of the hydrophobic semiconductor layer 400 described above, and thus omitted herein.

In some embodiments, the hydrophobic semiconductor layer 400 further covers another portion 110b of the substrate 110 configured to align with and face toward a bonding pad on another substrate, such as the bonding pad 230 on the substrate 210. That is, the hydrophobic semiconductor layer covering the portion 110b of the substrate 110 is acted as the bonding pad 120.

Figure 5:
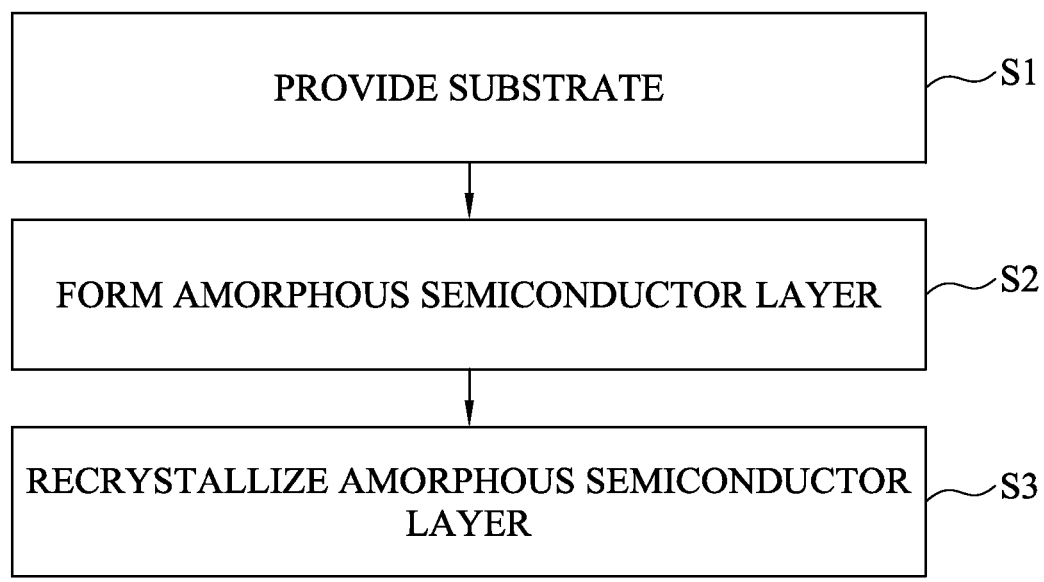
FIG. 5 is a flow chart illustrating a method for fabricating a cap substrate for a MEMS device in accordance with some embodiments.

A further aspect of the present disclosure provides a method of fabricating a cap substrate for a MEMS device. FIG. 5 is a flow chart illustrating a method for fabricating a cap substrate in accordance with some embodiments. Operations of the method in FIG. 5 are explained in FIGS. 6A-6C, which are cross-sectional views at various stages of fabricating the cap substrate in accordance with some embodiments. It should be understood that FIGS. 6A-6C are illustrative only and not intended to be limiting.

Figure 6A:
FIGS. 6A-6C are cross-sectional views at various stages of fabricating a cap substrate for a MEMS device in accordance with some embodiments.

In operation S1, a substrate 110 is provided, as shown in FIG. 6A. The specific features of the substrate 110 may be referred to those exemplified for the first substrate 110 of FIG. 2.

Figure 6B:
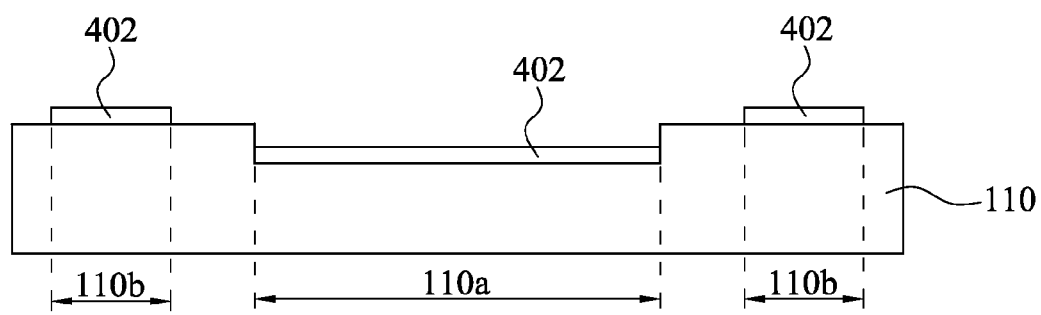
Figure 6C:
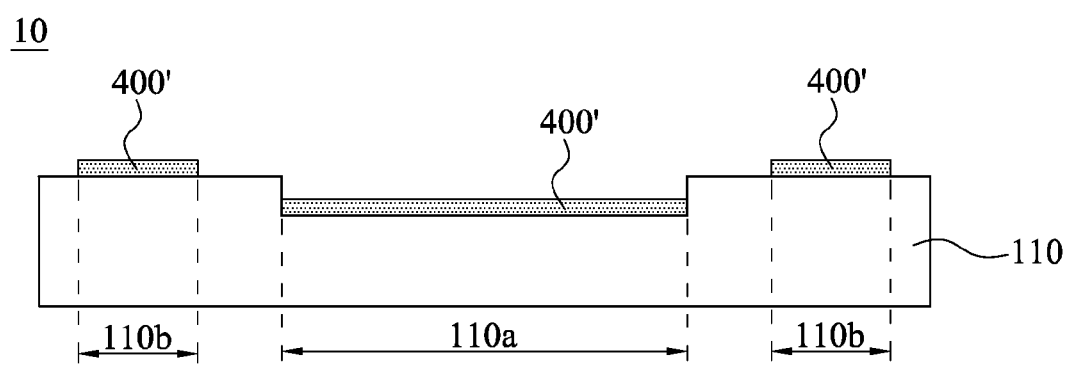

In operation S2, an amorphous semiconductor layer 402 is formed covering a portion 110a of the substrate 110, as shown in FIG. 6B. The portion 110a of the substrate 110 is configured to face toward a MEMS device, such as the MEMS device 300 of FIG. 2. In some embodiments, the amorphous semiconductor layer 402 is made of Ge, Si or a combination thereof. In some embodiments, the amorphous semiconductor layer 402 further includes a dopant selected from the group consisting of Group IIIA elements including B, Al, Ga, In and Tl and Group VA elements including N, P, As, Sb and Bi. In some embodiments, the amorphous semiconductor layer 402 is made of Ge, and the dopant is Sb.

In some embodiments, shown in FIGS. 6A-6B, operation S2 includes forming an amorphous semiconductor material 404 fully covering a surface of the substrate 110 by suitable processes, such as a deposition process (e.g., sputtering process), and then patterning the amorphous semiconductor material 404 to form the amorphous semiconductor layer 402 covering the portion 110a of the substrate 110 by suitable processes, such as photolithographic and etching (e.g., SEZ etching) processes.

In operation S3, the amorphous semiconductor layer 402 is recrystallized to covert to a crystallized semiconductor layer 400', as shown in FIG. 6C. The crystallized semiconductor layer 400' has a large grain size and high roughness and the crystallized semiconductor layer tend to be hydrophobic. That is, the crystallized semiconductor layer 400' is hydrophobic. In some embodiments, the amorphous semiconductor layer 402 is made of Ge, and operation S3 is conducted by heating the amorphous semiconductor layer 402 to a temperature in a range of 310° C. to 350° C. to convert to a crystallized Ge layer. In one specific example, the amorphous semiconductor layer 402 is made of Sb-doped Ge and has a water contact angle of about 30°. The recrystallization process of heating to a temperature in a range of 310° C. to 350° C. is performed on the amorphous semiconductor layer 402 made of Sb-doped Ge to convert it to a crystallized Sb-doped Ge layer, which has a water contact angle of about 110°. It is proved that the recrystallization process is effective for manufacturing a hydrophobic semiconductor layer.

In other embodiments, the amorphous semiconductor layer 402 is made of Si, and operation S3 is conducted by heating the amorphous semiconductor layer 402 to a temperature in a range of 600° C. to 800° C. to convert to a crystallized Si layer. In other embodiments, the amorphous semiconductor layer 402 is made of Si and Ge ($Si_xGe_{1-x}$ (0<x<1)), and operation S3 is conducted by heating the amorphous semiconductor layer 402 to a temperature in a range of 750° C. to 850° C. to convert to a crystallized $Si_xGe_{1-x}$ (0<x<1) layer.

In some embodiments, operation S2 further includes forming the amorphous semiconductor layer 402 covering another portion 110b of the substrate 110. The portion 110b of the substrate 110 is configured to align with and face toward a bonding pad on another substrate, such as the bonding pad 230 on the substrate 210 of FIG. 2.

Operation S3 may be performed after or before the substrate 110 of FIG. 6B is substantially aligned with a device substrate, such as the device substrate 20 of FIG. 2. Specifically, in some embodiments, after the substrate 110 of FIG. 6B is substantially aligned with the device substrate 20 of FIG. 2, a thermal process is performed to recrystallize the amorphous semiconductor layer 402 and to form bonding, such as eutectic bonding, a diffusion bonding or other suitable types of bonding, when a recrystallization temperature is lower than, equal to or slightly higher than a bonding temperature. If a recrystallization temperature is much higher than a bonding temperature, the recrystallization process should be performed before the substrate 110 of FIG. 6B is substantially aligned with the device substrate 20 of FIG. 2 to avoid effects of the elements of the device substrate 20 subjected to the recrystallization process.

As mentioned above, the present disclosure provides the embodiments including the hydrophobic semiconductor layer facing toward the MEMS device to diminish adhesion of the MEMS device to the surface there surrounding and to avoid the drawback of using the hydrophobic compound, so as to solve the reliability issue. The present disclosure also provides the embodiments including an operation of recrystallizing the amorphous semiconductor layer to effectively form the hydrophobic crystallized semiconductor layer.

According to some embodiments, a MEMS structure is provided, which includes a first substrate, a second substrate, a MEMS device and a hydrophobic semiconductor layer. The first substrate has a first portion. The second substrate is substantially parallel to the first substrate and has a second portion substantially aligned with the first portion. The MEMS device is between the first portion and the second portion. The hydrophobic semiconductor layer made of germanium (Ge), silicon (Si) or a combination thereof is on the first portion, the second portion or the first portion and the second portion and faces toward the MEMS device.

According to some embodiments, a cap substrate for a MEMS device is provided. The cap substrate includes a substrate and a hydrophobic semiconductor layer made of Ge, Si or a combination thereof covering a portion of the substrate configured to face toward the MEMS device.

According to some embodiments, a method of fabricating a cap substrate for a MEMS device is provided. The method includes: providing a substrate; forming an amorphous semiconductor layer covering a portion of the substrate, the portion of the substrate configured to face toward the MEMS device; and recrystallizing the amorphous semiconductor layer to covert to a crystallized semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro electro mechanical system (MEMS) structure, comprising:
    a first substrate having a first portion, wherein the first substrate is included in a cap substrate, and the cap substrate further comprises a first bonding pad on the first substrate;
    a second substrate substantially parallel to the first substrate and having a second portion substantially aligned with the first portion;
    a MEMS device between the first portion and the second portion; and
    a hydrophobic semiconductor layer made of germanium (Ge), silicon (Si), or a combination thereof on the first portion, the second portion, or the first portion and the second portion and facing toward the MEMS device, wherein the first bonding pad is composed of the same material as the hydrophobic semiconductor layer.

2. The MEMS structure of claim 1, wherein the hydrophobic semiconductor layer is crystallized.

3. The MEMS structure of claim 1, wherein the hydrophobic semiconductor layer further comprises a dopant selected from the group consisting of Group IIIA elements and Group VA elements.

4. The MEMS structure of claim 3, wherein the hydrophobic semiconductor layer is made of Ge, and the dopant is antimony (Sb).

5. The MEMS structure of claim 1, wherein the second substrate is included in a device substrate, and the device substrate further comprises a second bonding pad on the second substrate and bonded with the first bonding pad.

6. The MEMS structure of claim 5, wherein the second bonding pad is made of a material selected from the group consisting of aluminum (Al), gold (Au), titanium (Ti), tantalum (Ta), nickel (Ni), and tin (Sn).

7. The MEMS structure of claim 1, wherein at least one of the first portion and the second portion is a recess.

8. The MEMS structure of claim 1, wherein a surface of the hydrophobic semiconductor layer has a water contact angle greater than or equal to 80°.

9. The MEMS structure of claim 1, wherein the hydrophobic semiconductor layer has a grain size in a range of 0.08 micron to 0.2 micron.

10. The MEMS structure of claim 1, wherein the hydrophobic semiconductor layer has a roughness (RMS) in a range of 8 nm to 15 nm.

11. The MEMS structure of claim 1, wherein the hydrophobic semiconductor layer comprises Ge.

12. The MEMS structure of claim 1, wherein the first portion and the second portion are recesses.

13. The MEMS structure of claim 1, wherein the hydrophobic semiconductor layer is in contact with the first portion, the second portion, or the first portion and the second portion.

14. The MEMS structure of claim 1, wherein the first bonding pad further comprises a dopant selected from the group consisting of Group IIIA elements and Group VA elements.

15. The MEMS structure of claim 14, wherein the first bonding pad is made of Ge, and the dopant is antimony (Sb).

16. The MEMS structure of claim 1, wherein the first bonding pad comprises Ge.

17. The MEMS structure of claim 1, wherein a surface of the first bonding pad has a water contact angle greater than or equal to 80°.

18. The MEMS structure of claim 1, wherein the first bonding pad has a grain size in a range of 0.08 micron to 0.2 micron.

19. The MEMS structure of claim 1, wherein the first bonding pad has a roughness (RMS) in a range of 8 nm to 15 nm.

* * * * *